US008530316B2

(12) United States Patent
Cheng et al.

(10) Patent No.: US 8,530,316 B2
(45) Date of Patent: Sep. 10, 2013

(54) METHOD FOR FABRICATING A SEMICONDUCTOR DEVICE

(71) Applicants: Yu-Hung Cheng, Hsinchu (TW); Jhi-Cherng Lu, Hsinchu (TW); Ming-Hua Yu, Jhubei (TW); Chii-Horng Li, Jhubei (TW); Tze-Liang Lee, Hsinchu (TW)

(72) Inventors: Yu-Hung Cheng, Hsinchu (TW); Jhi-Cherng Lu, Hsinchu (TW); Ming-Hua Yu, Jhubei (TW); Chii-Horng Li, Jhubei (TW); Tze-Liang Lee, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/736,453

(22) Filed: Jan. 8, 2013

(65) Prior Publication Data
US 2013/0122675 A1 May 16, 2013

Related U.S. Application Data

(63) Continuation of application No. 12/765,331, filed on Apr. 22, 2010, now Pat. No. 8,377,784.

(51) Int. Cl.
*H01L 21/336* (2006.01)
(52) U.S. Cl.
USPC ............................ 438/300; 438/695; 134/4
(58) Field of Classification Search
USPC ............................ 438/300, 694, 695; 134/4
See application file for complete search history.

(56) References Cited

U.S. PATENT DOCUMENTS

| 5,783,498 | A | 7/1998 | Dotta |
| 5,976,981 | A | 11/1999 | Cheng |
| 6,933,235 | B2 | 8/2005 | Quevedo-Lopez et al. |
| 7,056,796 | B2 | 6/2006 | Wu |
| 7,112,495 | B2 | 9/2006 | Ko et al. |
| 8,377,784 | B2 * | 2/2013 | Cheng et al. .................. 438/300 |
| 2005/0136680 | A1 | 6/2005 | Hsu et al. |
| 2006/0148227 | A1 | 7/2006 | Kronke et al. |
| 2006/0216897 | A1 | 9/2006 | Lee et al. |
| 2007/0190730 | A1 | 8/2007 | Huang et al. |

FOREIGN PATENT DOCUMENTS

CN 101675508 3/2010

OTHER PUBLICATIONS

CN OA dated Dec. 19, 2012 from corresponding application No. CN 201010534184.1.

* cited by examiner

*Primary Examiner* — Charles Garber
*Assistant Examiner* — Reema Patel
(74) *Attorney, Agent, or Firm* — Lowe Hauptman & Ham, LLP

(57) ABSTRACT

A method for fabricating a semiconductor device, the method including growing a first semiconductor structure comprising a first semiconductor material on a surface of a substrate, wherein growing the first semiconductor structure includes forming a semiconductor particle comprising the first semiconductor material on a second semiconductor structure of the semiconductor device. The method further includes forming a protection layer of a second semiconductor material on the first semiconductor structure, wherein forming the protection layer includes forming the protection layer on the semiconductor particle. The method further includes removing a portion of the protection layer, wherein removing the portion of the protection layer includes fully removing the protection layer on the semiconductor particle and the semiconductor particle.

20 Claims, 7 Drawing Sheets

METHOD FOR FABRICATING A SEMICONDUCTOR DEVICE

CROSS-REFERENCE TO RELATED APPLICATION

The present application is a continuation of U.S. application Ser. No. 12/765,331, filed Apr. 22, 2010, which is incorporated by reference herein in its entirety.

TECHNICAL FIELD

The invention relates to integrated circuit fabrication, and more particularly to a semiconductor device fabricated by a selective growth process.

BACKGROUND

When a semiconductor device, such as a metal-oxide-semiconductor field-effect transistor (MOSFET), is scaled down through various technology nodes, high dielectric constant (high-k) gate dielectric layer and metal gate electrode layer are incorporated into the gate stack of the MOSFET to improve device performance with the decreased feature sizes. In addition, strained structures in source and drain (S/D) recess cavities of the MOSFET utilizing selectively grown silicon germanium (SiGe) may be used to enhance carrier mobility. The selective growth processes, however, suffer from drawbacks.

FIG. 1 shows a cross-sectional view of a semiconductor device 100 with conventional strained structures 120 in the source and drain (S/D) recess cavities. The semiconductor device 100 can be formed over an active region 106 of a substrate 102 adjacent to isolation regions 104. The semiconductor device 100 comprises lightly doped source/drain (LDD) regions 118 and source/drain (S/D) regions 120 formed in the active region 106 of the substrate 102, silicide regions 130 formed over the S/D regions 120, a gate stack 110 comprising a gate dielectric layer 114 and a gate electrode layer 112 sequentially formed over the substrate 102, and a pair of spacers 116 formed at two sides of the gate stack 110.

However, there are challenges to implement such features and processes in complementary metal-oxide-semiconductor (CMOS) fabrication. As the gate length and spacing between devices decrease, these problems are exacerbated. For example, problems arise in the selective growth processes that form the strained structures 120 in the S/D recess cavities. Since heterogeneous nucleation reactions during the selective growth processes may occur, particles 120a may be formed on the surfaces of the gate stack 110, gate spacers 116 and isolation regions 104. If they are not fully removed by subsequent clean processes, the un-removed particles 120a may become embedded in the semiconductor device 100. The un-removed particles 120a may provide carrier transportation paths during device operation, thereby increasing the likelihood of device instability and/or device failure.

Accordingly, what is needed is a method for fabricating a strained structure having no particle in a semiconductor device.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

Figure 1:
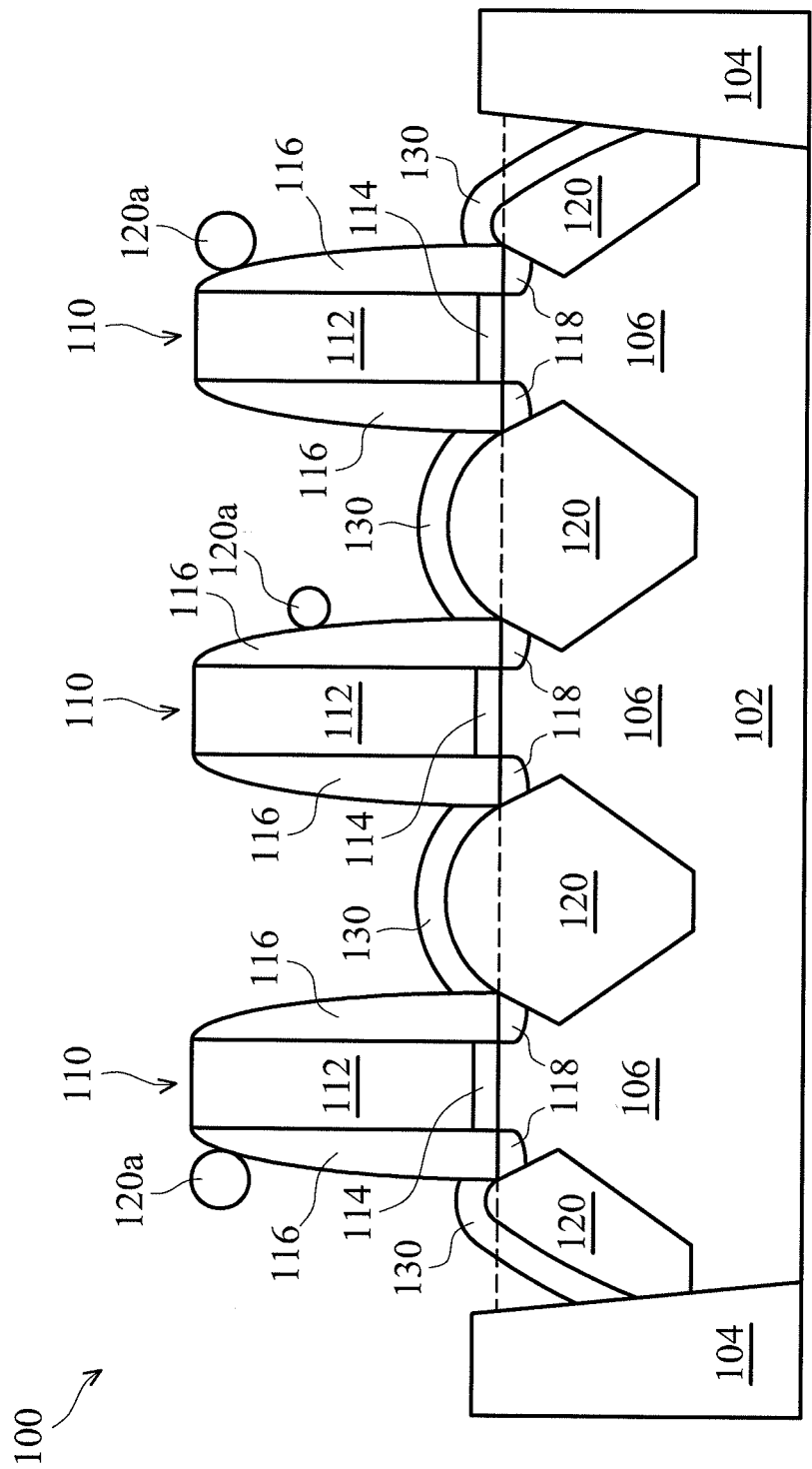
FIG. 1 shows a cross-sectional view of a semiconductor device with conventional strained structures.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
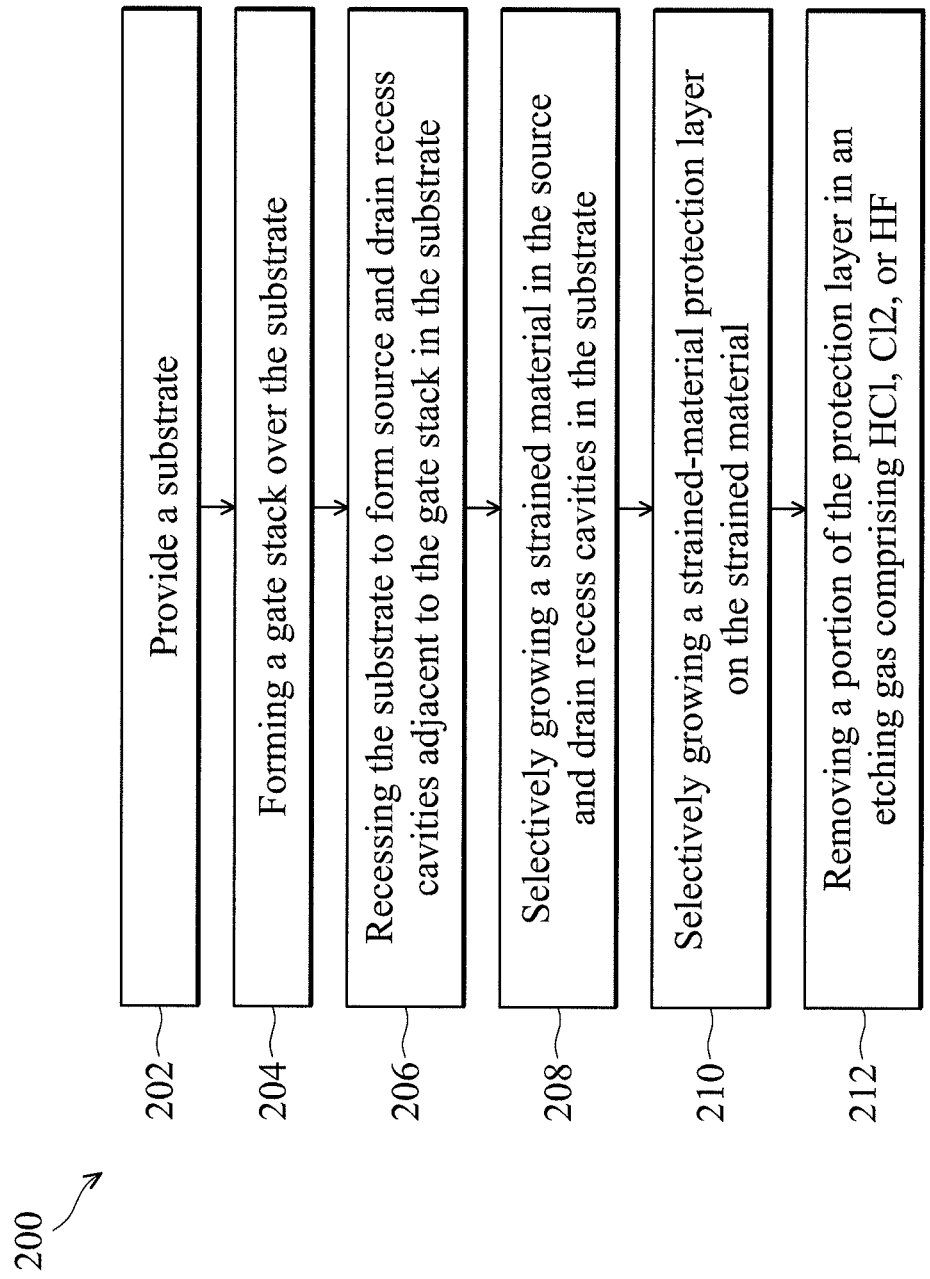
FIG. 2 is a flowchart illustrating a method for fabricating a semiconductor device having a strained structure according to various aspects of the present disclosure.

FIG. 2 is a flowchart illustrating a method 200 for fabricating a semiconductor device having a strained structure 320 (FIG. 3E) according to various aspects of the present disclosure. FIGS. 3A-E show schematic cross-sectional views of the semiconductor device having the strained structure 320 at various stages of fabrication according to an embodiment of the method 200 of FIG. 2. It is understood that other parts of the semiconductor devices 300 may be fabricated with normal complementary metal-oxide-semiconductor (CMOS) technology processes, and thus some processes are briefly described herein. Also, FIGS. 2 through 3E are simplified for a better understanding of the inventive concepts of the present disclosure. For example, although the figures illustrate the strained structure 320 for the semiconductor devices 300, it is understood a semiconductor device fabricated using methods in accordance with the invention may be part of an integrated circuit (IC) that may include a number of other devices including resistors, capacitors, inductors, fuses, etc.

Figure 3A:
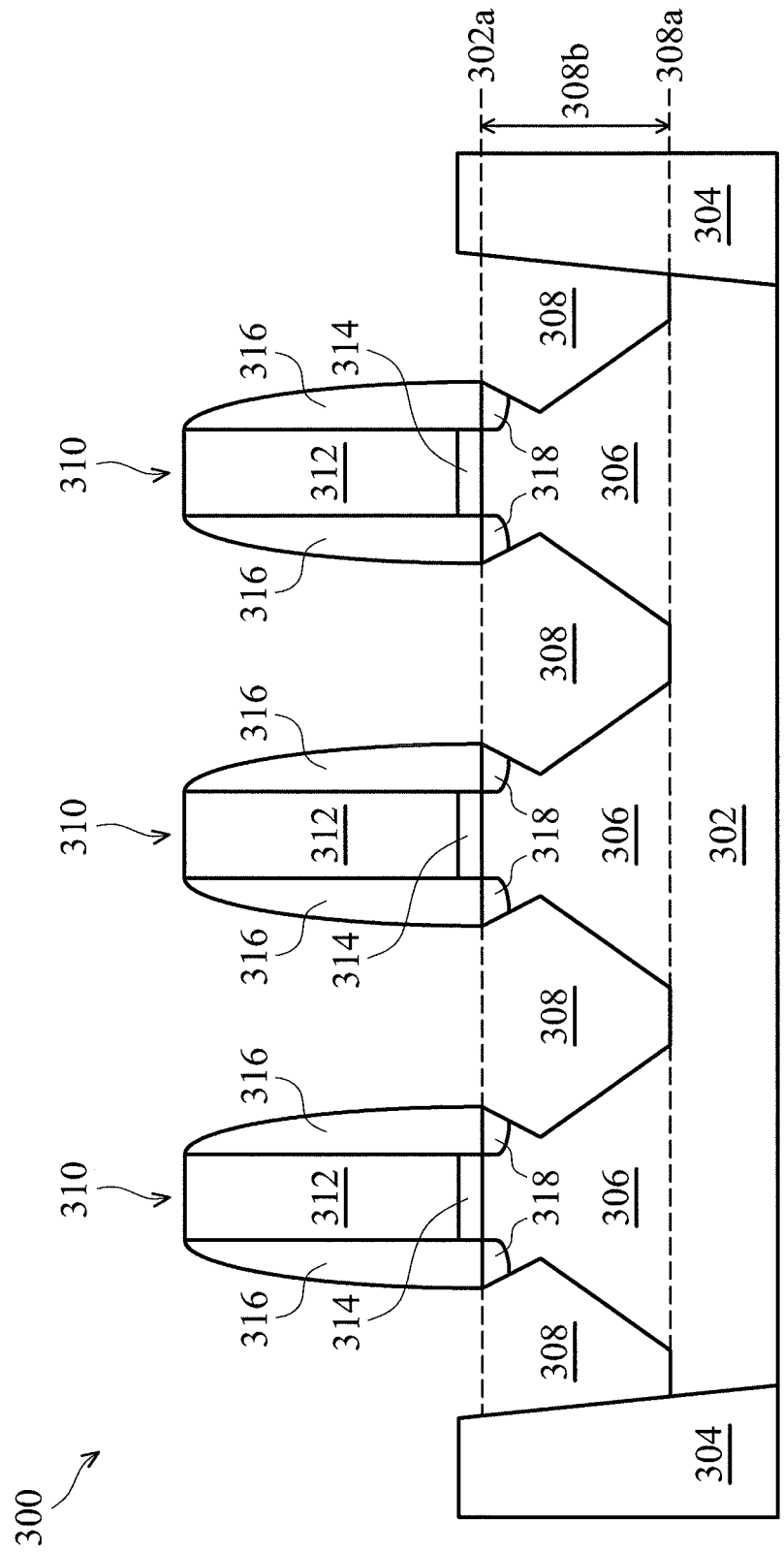
FIGS. 3A-E show schematic cross-sectional views of a semiconductor device having a strained structure at various stages of fabrication according to various aspects of the present disclosure.

Referring to FIGS. 2 and 3A, the method 200 begins at step 202 wherein a substrate 302 including active regions 306 and isolation regions 304 is provided. In one embodiment, the substrate 302 comprises a crystalline silicon substrate (e.g., wafer). The substrate 302 may include various doping configurations depending on design requirements (e.g., p-type substrate or n-type substrate). Further, the substrate 302 may include an epitaxial layer (epi layer), may be strained for performance enhancement, and/or may include a silicon-on-insulator (SOI) structure.

The active regions 306 may include various doping configurations depending on design requirements as known in the art. In some embodiments, the active regions 306 may be doped with p-type or n-type dopants. For example, the active regions 306 may be doped with p-type dopants, such as boron or $BF_2$; n-type dopants, such as phosphorus or arsenic; and/or combinations thereof. The active regions 306 may act as regions configured for an N-type metal-oxide-semiconductor transistor device (referred to as an NMOS) and regions configured for a P-type metal-oxide-semiconductor transistor device (referred to as a PMOS).

The isolation regions 304 may be formed on the substrate 302 to isolate the various active regions 306. The isolation regions 304 may utilize isolation technology, such as local oxidation of silicon (LOCOS) or shallow trench isolation (STI), to define and electrically isolate the various active regions 306. In the present embodiment, the isolation region 304 includes a STI. The isolation regions 304 may comprise silicon oxide, silicon nitride, silicon oxynitride, fluoride-doped silicate glass (FSG), a low-K dielectric material, other suitable materials, and/or combinations thereof. The isolation regions 304, and in the present embodiment, the STI, may be formed by any suitable process. As one example, the formation of the STI may include patterning the semiconductor substrate 302 by a conventional photolithography process, etching a trench in the substrate 302 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Still referring to FIGS. 2 and 3A, the method 200 continues with step 204 in which a gate stack 310 is formed by sequentially depositing and patterning a gate dielectric layer 314 and a gate electrode layer 312 on the substrate 302. The gate stack 310 may be formed using any suitable process, including the processes described herein.

In one example, the gate dielectric layer 314 and gate electrode layer 312 are sequentially deposited on the substrate 302. In some embodiments, the gate dielectric layer 314 may include silicon oxide, silicon nitride, silicon oxy-nitride, high-k dielectric, or other suitable material. The high-k dielectric layer may include a binary high-k film such as HfOx. In some alternative embodiments, the high-k dielectric layer 314 may optionally include other high-k dielectrics such as LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, or other suitable materials. In the present embodiment, the gate dielectric layer 314 comprises a thickness in the range of about 10 to 30 Å. The gate dielectric layer 314 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 314 may further comprise an interfacial layer (not shown) to reduce damages between the gate dielectric layer 314 and the substrate 302. The interfacial layer may comprise silicon oxide.

In some embodiments, the gate electrode layer 312 may comprise a single layer or multilayer structure. In the present embodiment, the gate electrode layer 312 may comprise poly-silicon. Further, the gate electrode layer 312 may be doped using poly-silicon with the same or different doping. In some alternative embodiments, the gate electrode layer 312 may include a metal such as Al, Cu, W, Ti, Ta, TiN, TiAl, TiAlN, TaN, NiSi, CoSi, other suitable conductive materials, or combinations thereof. In the present embodiment, the gate electrode layer 312 comprises a thickness in the range of about 30 nm to about 60 nm. The gate electrode layer 312 may be formed using a suitable process such as atomic layer deposition (ALD), chemical vapor deposition (CVD), physical vapor deposition (PVD), plating, or combinations thereof.

Then, a layer of photoresist is formed over the gate stack 310 by a suitable process, such as spin-on coating, and patterned to form a patterned photoresist feature by a proper lithography patterning method. A width of the patterned photoresist feature is in the range of about 15 to 45 nm. The patterned photoresist feature can then be transferred using a dry etching process to the underlying layers (i.e., the gate electrode layer 312 and the gate dielectric layer 314) to form the gate stack 310. The photoresist layer may be stripped thereafter.

In another example, a hard mask layer (not shown) is formed over the gate stack 310; a patterned photoresist layer is formed on the hard mask layer; the pattern of the photoresist layer is transferred to the hard mask layer and then transferred to the gate electrode layer 312 and the gate dielectric layer 314 to form the gate stack 310. The hard mask layer comprises silicon oxide. In some alternative embodiments, the hard mask layer may optionally comprise silicon nitride, silicon oxynitride, and/or other suitable dielectric materials, and may be formed using a method such as CVD or PVD. The hard mask layer comprises a thickness in the range from about 100 to 800 Å.

Still referring to FIG. 3A, lightly doped source/drain (LDD) regions 318 may be formed in the active regions 306 of the substrate 302. The LDD regions 318 may be formed in the active regions 306 by one or more implantation processes, such as an ion implantation process. The doping species may depend on the type of device being fabricated, such as an NMOS or PMOS device. For example, the LDD regions 318 may be doped with p-type dopants, such as boron or $BF_2$; n-type dopants, such as phosphorus or arsenic; and/or combinations thereof. The LDD regions 318 may comprise various doping profiles. The LDD regions 318 may be aligned with an outer edge of the gate stack 310 following the ion implantation process.

Still referring to FIG. 3A, the semiconductor device 300 further includes a dielectric layer (not shown) formed over the substrate 302 and the gate stack 310. The dielectric layer may include silicon oxide, silicon nitride, silicon oxy-nitride, or other suitable material. The dielectric layer may comprise a single layer or multilayer structure. The dielectric layer may be formed by CVD, PVD, ALD, or other suitable technique. The dielectric layer includes a thickness ranging from about 5 to 15 nm. Then, an anisotropic etching is performed on the dielectric layer to form a pair of spacers 316 on two sides of the gate stack 310.

Referring to FIGS. 2 and 3A, the method 200 continues with step 206 in which the substrate 302 is recessed to form source and drain (S/D) recess cavities 308 adjacent to the gate stack 310 in the substrate 302. Using the pair of spacers 316 as hard masks, a biased etching process is performed to recess a top surface 302a of the substrate 302 that are unprotected or exposed to form the S/D recess cavities 308. In an embodiment, the etching process may be performed under a pressure of about 1 mTorr to 1000 mTorr, a power of about 50 W to 1000 W, a bias voltage of about 20V to 500V, at a temperature of about 40° C. to 60° C., using a HBr and/or Cl2 as etch gases. The etching process may also comprise He, O2 and/or HeO2 as a passivation gas. In some embodiments, the etch gases and the passivation gas are alternatively added to the etching chamber during the dry etching process so that the passivation gas may form a polymer layer on the sidewalls of the S/D recess cavities 308 to protect the LDD regions 318 from etching away when the etch gases are added. Also, in some embodiments, the bias voltage used in the etching process may be tuned to allow better control of an etching direction to achieve desired profiles for the S/D recess cavities 308. In some embodiments, a depth 308b between the top surface 302a of the substrate 302 and bottom 308a of the S/D recess cavities 308 is in the range of about 300 to 2000 nm.

Figure 3B:
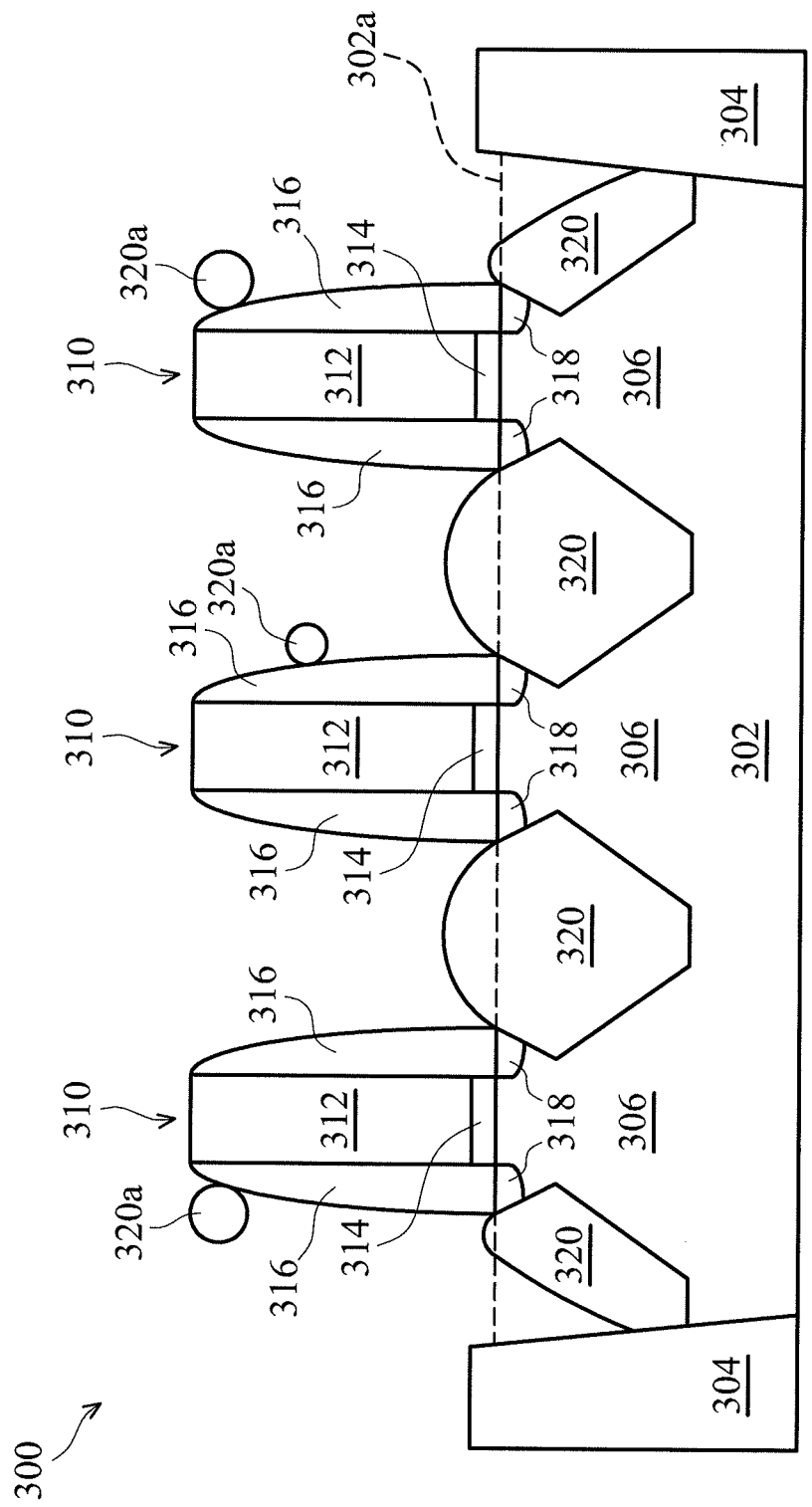

Referring to FIGS. 2 and 3B, the method 200 continues with step 208 in which a strained material 320 is selectively grown in the S/D recess cavities 308 in the top surface 302a of the substrate 302. In the present embodiment, a pre-cleaning process may be performed to clean the S/D recess cavities 308 with HF or other suitable solution. Then, the strained material 320, such as silicon germanium (SiGe), is selectively grown by a low-pressure chemical vapor deposition (LPCVD) process to form the source and drain regions 320 of the PMOS or NMOS devices. The LPCVD process is performed at a temperature of about 400 to 800° C. and under a pressure of about 1 to 200 Torr, using $SiH_2Cl_2$, $GeH_4$, HCl, and $H_2$ as reaction gases. A partial pressure of $GeH_4$ in the reaction gases is in the range of 2.5E-5 to 2.5E-4 Torr. In one embodiment, the selective growth of the strained material 320 continues until the material 320 extends a distance ranging from about 10 to 100 nm above the surface 302a of the substrate 302. In another embodiment, the selective growth of the strained material 320 is terminated while the material 320 is a distance ranging from about 10 to 100 nm below the surface 302a of the substrate 302. Since the lattice constant of the strained material 320 is different from the substrate 302, the channel region of the substrate 302 is strained or stressed to enable carrier mobility of the device and enhance the device performance.

It should be noted that besides the homogeneous nucleation reactions to form the strained material 320 in the S/D recess cavities 308 in the substrate 302 during the selective growth processes, some heterogeneous nucleation reactions may also occur to form particles 320a on the surfaces of the gate stack 310, gate spacers 316, and/or isolation regions 304. If these particles 320a are not fully removed by subsequent clean processes, the un-removed particles 320a may provide carrier transportation paths during device operation, thereby increasing the likelihood of device instability and/or device failure.

Figure 3C:
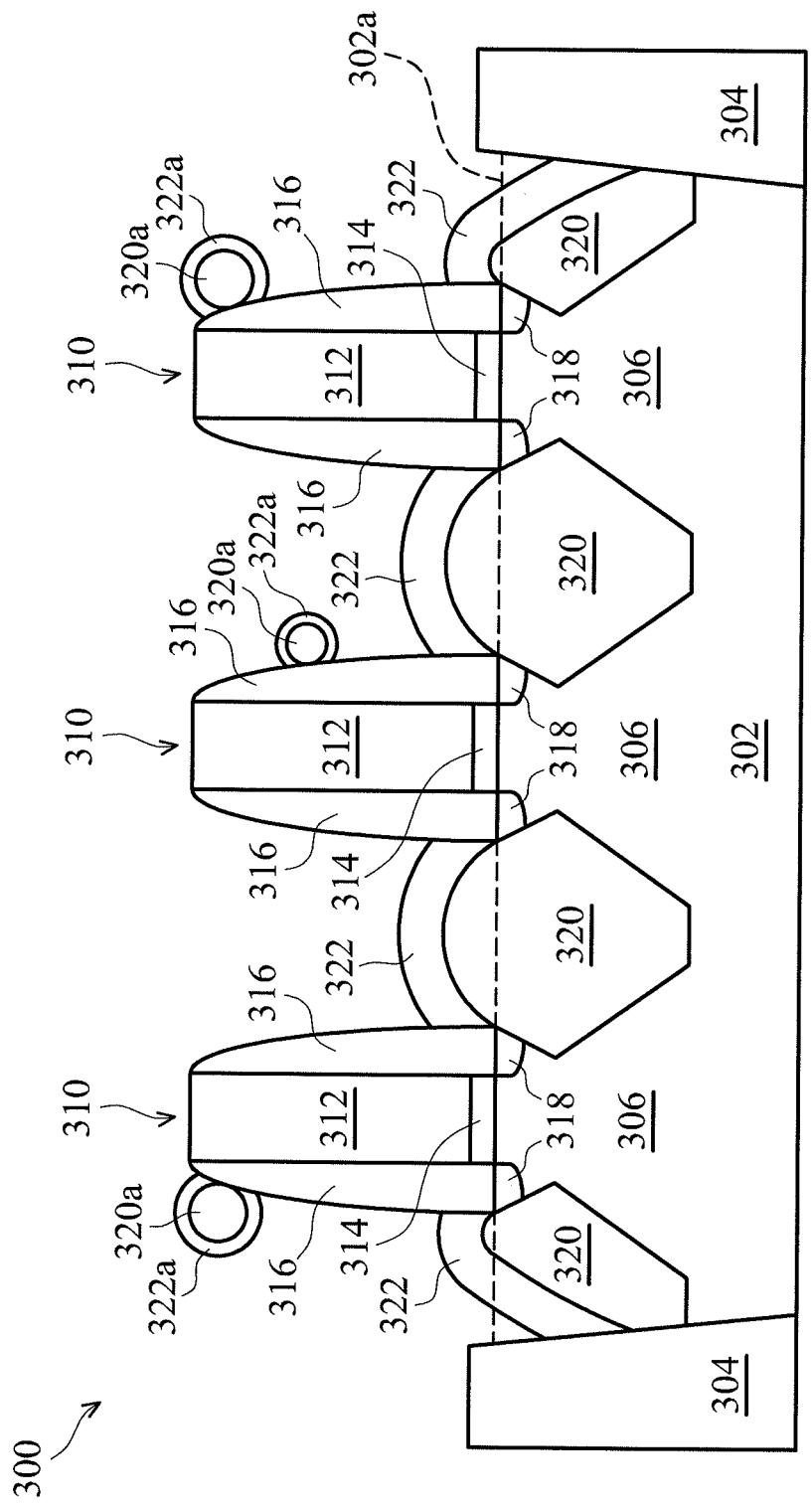

Referring to FIGS. 2 and 3C, the method 200 continues with step 210 in which a strained-material protection layer 322 is selectively grown on the strained material 320. In the present embodiment, the strained-material protection layer 322 is selectively grown by a LPCVD process. The LPCVD process is performed at a temperature of about 400 to 800° C. and under a pressure of about 1 to 200 Torr, using $SiH_2Cl_2$, $SiH_4$, $GeH_4$, HCl, $B_2H_6$, and $H_2$ as reaction gases. A partial pressure of $GeH_4$ in the reaction gases is in the range of 2E-5 to 2E-4 Torr. It is noted that, in some embodiments, the strained-material protection layer 322 may be similar to the strained material 320. This is because both are silicon germanium (SiGe) but the former may have less Ge concentration due to the smaller partial pressure of $GeH_4$. Further, homogeneous nucleation reactions during the selective growth processes may simultaneously occur on the strained material 320 and particles 320a, thereby simultaneously forming the strained-material protection layer 322 on the strained material 320 and the strained-material protection layer 322a to enclose the particles 320a. In one embodiment, the strained-material protection layer 322 has a thickness in the range of about 0.5 to 10 nm. The steps of selectively growing the strained material 320 and the strained-material protection layer 322 may be performed in a single reactor.

Figure 3D:
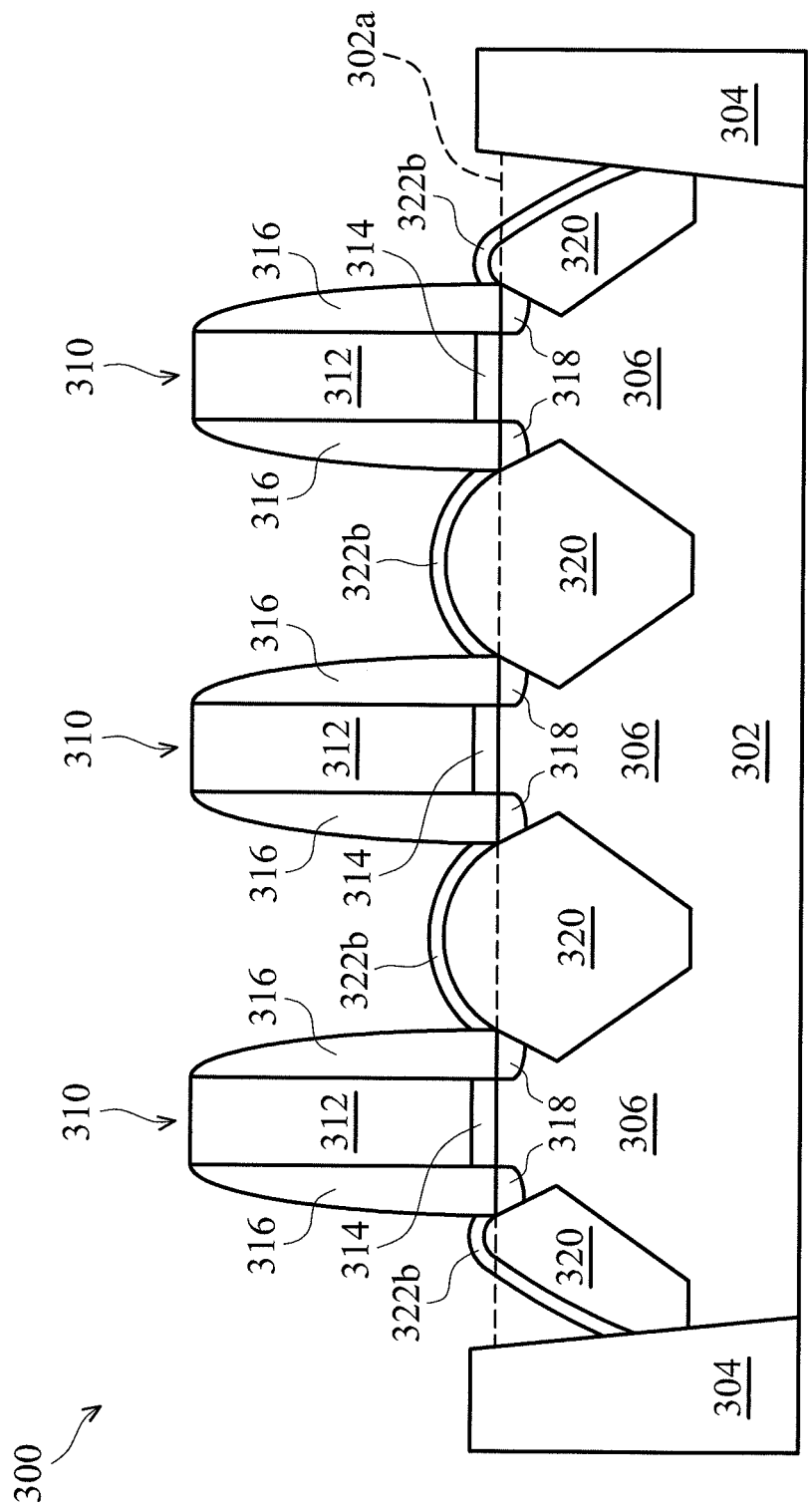
Figure 3E:
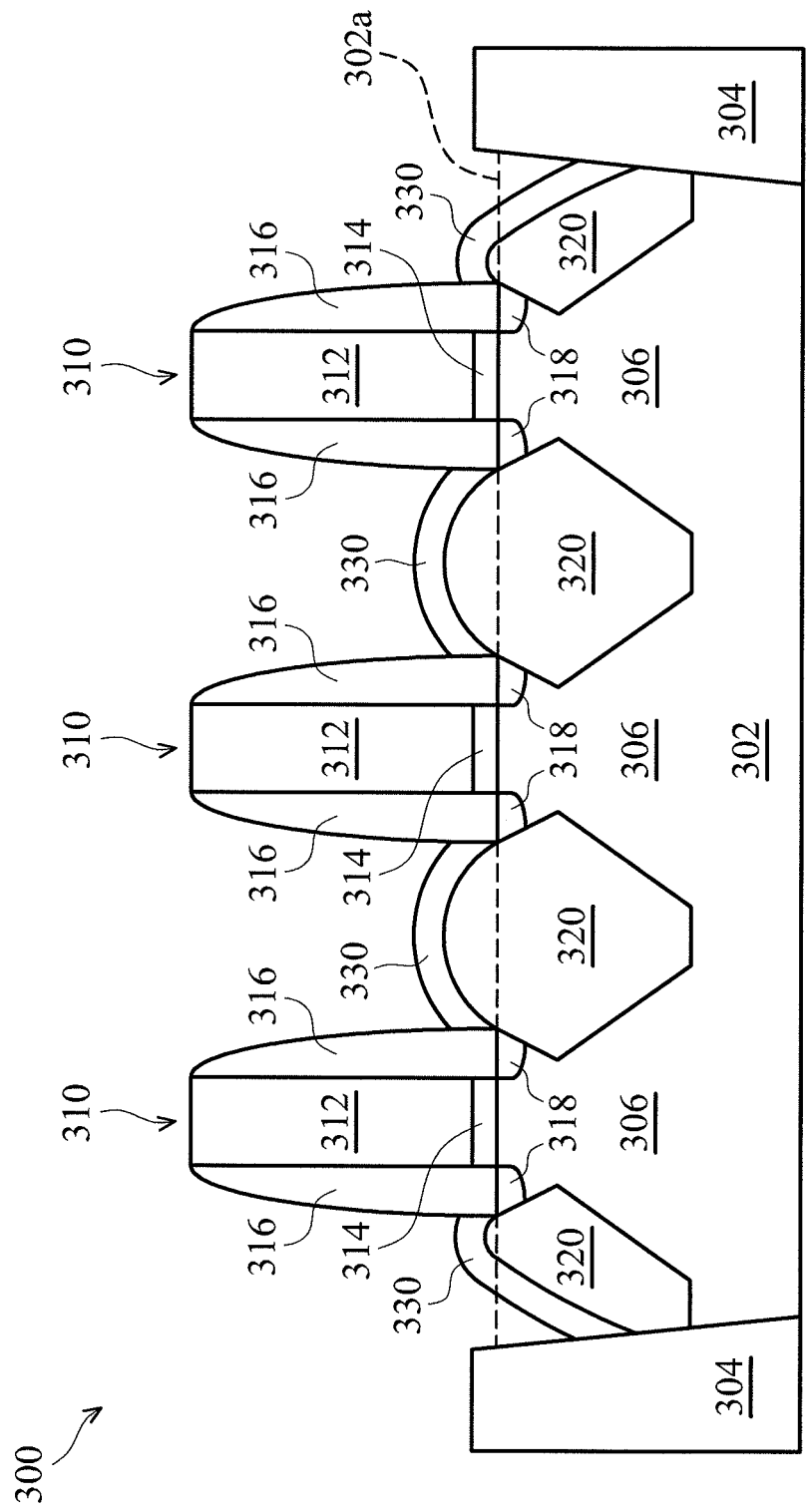

Referring to FIGS. 2 and 3D, the method 200 continues with step 212 in which a portion of the protection layer is removed in an etching gas comprising HCl, $Cl_2$, or HF. In the present embodiment, the step of removing a portion of the protection layer is performed at a temperature of about 400 to 800° C. and under a pressure of about 1 to 200 Torr, using HCl and $H_2$ as etch gases. The steps of selectively growing the protection layer 322 on the strained material 320 and removing a portion of the protection layer 322 may be performed in a single reactor.

In order to maintain the ability of the strained material 320 to enhance carrier mobility, the step of removing a portion of the protection layer 322 may partially or fully remove the protection layer 322, but may not remove any of the strained material 320. Since the strained-material protection layers 322, 322a and the strained materials 320, 320a are similar, the surface energy of those layers 320, 320a, 322, and 322a may dominate their removing rate under same etching processes. For example, the surface energies of both the strained-material protection layer 322a and particles 320a are higher than that of the strained-material protection layer 322 on the strained material 320. Thus the materials in the particles 320a, 322a are removed faster during the etching process and can be fully removed, while the strained-material protection layer 322 is removed slower and a portion 322b of the strained-material protection layer 322 remains. Accordingly, Applicant's method of fabricating a semiconductor device 300 may fully remove the particles 320a while retaining the strained material 320 to enhance carrier mobility and upgrade the device performance and yield.

After the steps shown in FIG. 2 have been performed, then transistor fabrication may be completed using standard CMOS process. Referring to FIG. 3E, silicide regions 330 are formed on the S/D regions 320 by a silicide process. For example, a salicide process may selectively grow a silicon-containing capping layer (not shown) over the remaining protection layer 322b (if any) or the strained material 320, and then the capping layer is silicided by a reaction between the silicon and a metal material to form silicide regions 330. The silicide regions 330 may comprise a material selected from titanium silicide, cobalt silicide, nickel silicide, platinum silicide, erbium silicide, and palladium silicide. Then, subsequent processes, comprising interconnect processing, must be performed after forming the silicide regions 330 to complete the semiconductor device 300 fabrication.

One aspect of this description is directed to a method for fabricating a semiconductor device. The method includes growing a first semiconductor structure comprising a first semiconductor material on a surface of a substrate, wherein growing the first semiconductor structure comprises forming a semiconductor particle comprising the first semiconductor material on a second semiconductor structure of the semiconductor device. The method further includes forming a protection layer of a second semiconductor material on the first semiconductor structure, wherein forming the protection layer comprises forming the protection layer on the semiconductor particle. The method further includes removing a portion of the protection layer, wherein removing the portion of the protection layer comprises fully removing the protection layer on the semiconductor particle and the semiconductor particle.

Another aspect of this description relates to a method for fabricating a semiconductor device. The method includes forming a gate stack on a top surface of a substrate. The method further includes growing source/drain structures includes a first semiconductor material in a cavity adjacent to the gate stack, wherein growing the source/drain structures comprises forming a semiconductor particle comprising the first semiconductor material on the gate stack. The method further includes forming a protection layer comprising a second semiconductor material on the source/drain structure, wherein forming the protection layer comprises forming the protection layer on the semiconductor particle. The method further includes removing a portion of the protection layer, wherein removing the portion of the protection layer comprises fully removing the protection layer on the semiconductor particle and the semiconductor particle.

Still another aspect of this description relates to a method for fabricating a semiconductor device. The method includes epitaxially growing a first semiconductor structure comprising a first semiconductor material on a surface of a substrate, wherein epitaxially growing the first semiconductor structure comprises epitaxially growing a semiconductor particle comprising the first semiconductor material on a second semiconductor structure of the semiconductor device. The method further includes epitaxially growing a protection layer of a second semiconductor material on the first semiconductor structure, wherein epitaxially growing the protection layer comprises epitaxially growing the protection layer on the semiconductor particle. The method further includes dry etching a portion of the protection layer, wherein dry etching the portion of the protection layer comprises fully removing the protection layer on the semiconductor particle and the semiconductor particle.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements. The invention can be used to form or fabricate a semiconductor device using selective growth processes. In this way, a strained structure having no particle in a semiconductor device is fabricated.

What is claimed is:

1. A method for fabricating a semiconductor device, comprising:
   growing a first semiconductor structure comprising a first semiconductor material on a surface of a substrate, wherein growing the first semiconductor structure comprises forming a semiconductor particle comprising the first semiconductor material on a second semiconductor structure of the semiconductor device;
   forming a protection layer of a second semiconductor material on the first semiconductor structure, wherein forming the protection layer comprises forming the protection layer on the semiconductor particle; and
   removing a portion of the protection layer, wherein removing the portion of the protection layer comprises fully removing the protection layer on the semiconductor particle and the semiconductor particle.

2. The method of claim 1, wherein growing the first semiconductor structure comprises:
   growing the first semiconductor structure on the surface of the substrate by homogeneous nucleation reactions; and
   forming the semiconductor particle on the second semiconductor structure by heterogeneous nucleation reactions.

3. The method of claim 1, wherein forming the protection layer comprises forming the protection layer to a thickness ranging from about 0.5 nanometers (nm) to about 10 mm.

4. The method of claim 1, wherein removing the portion of the protection layer comprises, removing the protection layer on the semiconductor particle and the semiconductor particle at a higher removal rate than the protective layer on the first semiconductor structure.

5. The method of claim 1, wherein each of the semiconductor particle and the protection layer on the semiconductor particle have a higher surface energy than the protection layer on the first semiconductor structure.

6. The method of claim 1, further comprising forming at least one cavity in the substrate, wherein growing the first semiconductor structure comprises growing the first semiconductor structure at least partially in the at least one cavity.

7. The method of claim 6, wherein growing the first semiconductor structure comprises growing the first semiconductor structure to a height ranging from about 10 nm to about 100 nm above a top surface of the substrate.

8. A method for fabricating a semiconductor device, comprising:
   forming a gate stack on a top surface of a substrate;
   growing source/drain structures comprising a first semiconductor material in a cavity adjacent to the gate stack, wherein growing the source/drain structures comprises forming a semiconductor particle comprising the first semiconductor material on the gate stack;
   forming a protection layer comprising a second semiconductor material on the source/drain structure, wherein forming the protection layer comprises forming the protection layer on the semiconductor particle; and
   removing a portion of the protection layer, wherein removing the portion of the protection layer comprises fully removing the protection layer on the semiconductor particle and the semiconductor particle.

9. The method of claim 8, forming the gate stack comprises forming a spacer on each sidewall of the gate stack, wherein the semiconductor particle is formed on the spacer.

10. The method of claim 8, wherein growing the source/drain structures comprises growing the source/drain structures in a portion of the cavity under the spacer.

11. The method of claim 8, further comprising forming lightly doped drain (LDD) regions in the substrate, wherein the LDD regions are aligned with an outer edge of the gate stack.

12. The method of claim 8, wherein growing the source/drain structures comprises:
    growing the source/drain structures by homogeneous nucleation reactions; and
    forming the semiconductor particle by heterogeneous nucleation reactions.

13. The method of claim 8, wherein removing the portion of the protection layer comprises, removing the protection layer on the semiconductor particle and the semiconductor particle at a higher removal rate than the protective layer on the source/drain structures.

14. The method of claim 8, wherein each of the semiconductor particle and the protection layer on the semiconductor particle have a higher surface energy than the protection layer on the source/drain structures.

15. The method of claim 8, wherein growing the source/drain structures comprises growing the first semiconductor structure to a height ranging from about 10 nm to about 100 nm above the top surface of the substrate.

16. The method of claim 8, further comprising forming a silicide region over the source/drain structures, wherein forming the silicide region comprises:
    forming a capping layer over the source/drain structures; and
    reacting the capping layer with at least one of a remaining portion of the protection layer or the source/drain structures.

17. The method of claim 16, wherein forming the capping layer comprises forming the capping layer by a salicide process.

18. A method for fabricating a semiconductor device, comprising:
  epitaxially growing a first semiconductor structure comprising a first semiconductor material on a surface of a substrate, wherein epitaxially growing the first semiconductor structure comprises epitaxially growing a semiconductor particle comprising the first semiconductor material on a second semiconductor structure of the semiconductor device;
  epitaxially growing a protection layer of a second semiconductor material on the first semiconductor structure, wherein epitaxially growing the protection layer comprises epitaxially growing the protection layer on the semiconductor particle; and
  dry etching a portion of the protection layer, wherein dry etching the portion of the protection layer comprises fully removing the protection layer on the semiconductor particle and the semiconductor particle.

19. The method of claim 18, wherein epitaxially growing the first semiconductor structure comprises:
  epitaxially growing the first semiconductor structure on the surface of the substrate by homogeneous nucleation reactions; and
  epitaxially growing the semiconductor particle on the second semiconductor structure by heterogeneous nucleation reactions.

20. The method of claim 18, wherein dry etching the portion of the protection layer comprises using an etching gas comprising at least one of HCl, Cl2 or HF, each of the semiconductor particle and the protection layer on the semiconductor particle have a higher surface energy than the protection layer on the first semiconductor structure, and the etching gas has a higher selectivity for the protection layer on the semiconductor particle and the semiconductor particle than the protective layer on the first semiconductor structure.

* * * * *